United States Patent [19]

Klein

[11] 4,326,128
[45] Apr. 20, 1982

[54] INCREMENTAL ROTARY TRANSMITTER

[75] Inventor: Ottokar Klein, Weiterstadt, Fed. Rep. of Germany

[73] Assignee: Robert Bosch GmbH, Stuttgart, Fed. Rep. of Germany

[21] Appl. No.: 146,025

[22] Filed: May 2, 1980

[30] Foreign Application Priority Data

May 25, 1979 [DE] Fed. Rep. of Germany ....... 2921103

[51] Int. Cl.³ .............................................. H01J 3/14
[52] U.S. Cl. .......................... 250/231 SE; 250/237 G
[58] Field of Search .................... 250/231 SE, 237 G; 356/395; 324/175; 340/367 P

[56] References Cited

U.S. PATENT DOCUMENTS 3,995,156  11/1976  Angersbach et al. .......... 250/237 G Primary Examiner—David C. Nelms
Assistant Examiner—Darwin R. Hostetter
Attorney, Agent, or Firm—Frishauf, Holtz, Goodman & Woodward

[57] ABSTRACT

An incremental rotary transmitter is proposed for mounting upon the free end of a shaft. The transmitter comprises a pulse disc rigidly secured to the shaft and a relatively stationary scanning disc freely mounted on the same shaft. The scanning disc is thus subject to the same flexing oscillations or errors in true running of the shaft as the pulse disc, so that measurement errors due to eccentric movements of the pulse disc are substantially reduced.

2 Claims, 2 Drawing Figures

4,326,128

INCREMENTAL ROTARY TRANSMITTER

BACKGROUND OF THE INVENTION

The invention relates to an incremental rotary transmitter of the kind comprising a rotatably mounted pulse disc and a relatively stationary scanning grid.

Incremental rotary transmitters have been long known in the art and serve principally for automatic angular measurement. A special field of application is that of the measurement, supervision and control of rpm. Rotary transmitters of the above kind are employed to convert an angular movement of a shaft into digital electrical signals. For this purpose a pulse disc is employed which is coupled to the transmitter shaft and carries a pattern of stripes uniformly distributed about its periphery. The pulse disc is illuminated from one side, and at the side of the pulse disc remote from the light there is arranged a fixed scanning grid with associated photoelectric elements. These latter convert into electrical signals the variations in luminosity resulting from the rotation of the pulse disc.

The determining factor for the digital resolution of an angular variation is the number of stripes per unit angle carried upon the pulse disc of the transmitter, or the so-called stripe number or density. For practical applications in which a particularly high level of resolution is required, pulse discs are employed having a very high stripe density (up to 20,000 stripes around the disc). Such a high stripe density means that the stripes and the intervening gaps are very narrow, so that small eccentricity errors of the pulse disc, due to the usual manufacturing tolerances, will of themselves be the cause of measurement errors. This error source becomes particularly important if the pulse disc is mounted upon the end of a comparatively narrow shaft in which flexing oscillations can be set up, or upon a shaft which does not run true. In this case there will appear lateral fluctuations about the centre point with respect to the scanning grid, which is fixed at a distance of a fraction of a millimeter from the pulse disc, which fluctuations will exacerbate the above mentioned errors.

A device is already known (DBP 20 39 893) wherein a non-rotatably arranged member is mounted upon the rotatable part of the device. However, in that case the subject matter relates to a rotating electromagnetic transducer, of which the instantaneous angular position is immaterial.

SUMMARY OF THE INVENTION

According to the present invention there is provided in an incremental rotary transmitter comprising a pulse disc secured to a shaft for rotation therewith about the axis of the shaft and in a plane perpendicular to the axis, and a relatively stationary scanning grid arranged closely adjacent and parallel to the pulse disc, the improvement wherein the scanning grid is freely mounted upon the shaft carrying the pulse disc.

The rotary transmitter according to the invention possesses the advantage that both static errors as well as errors due to dynamic fluctuations about the nominal centre point of the two transmitter elements (pulse disc and scanning grid) are reduced to an acceptable level, since the scanning grid, by virtue of its mounting on the same shaft as the pulse disc, will be subject to the same lateral deviations as the latter. It is to be regarded as a further advantage that critical adjusting operations can to a large extent be omitted because the desired coaxial relationship of the two elements of the transmitter is greatly facilitated by their mounting on a common shaft.

The preferred embodiment of the invention has the further advantage that flexing oscillations of the free end of the shaft are substantially suppressed by the use of vibration damping elements in the mounting arrangement of the stationary scanning grid.

BRIEF DESCRIPTION OF THE DRAWINGS

An embodiment of the invention will now be described by way of example, with reference to the accompanying drawings, wherein.

DESCRIPTION OF PREFERRED EMBODIMENT

Figure 1:
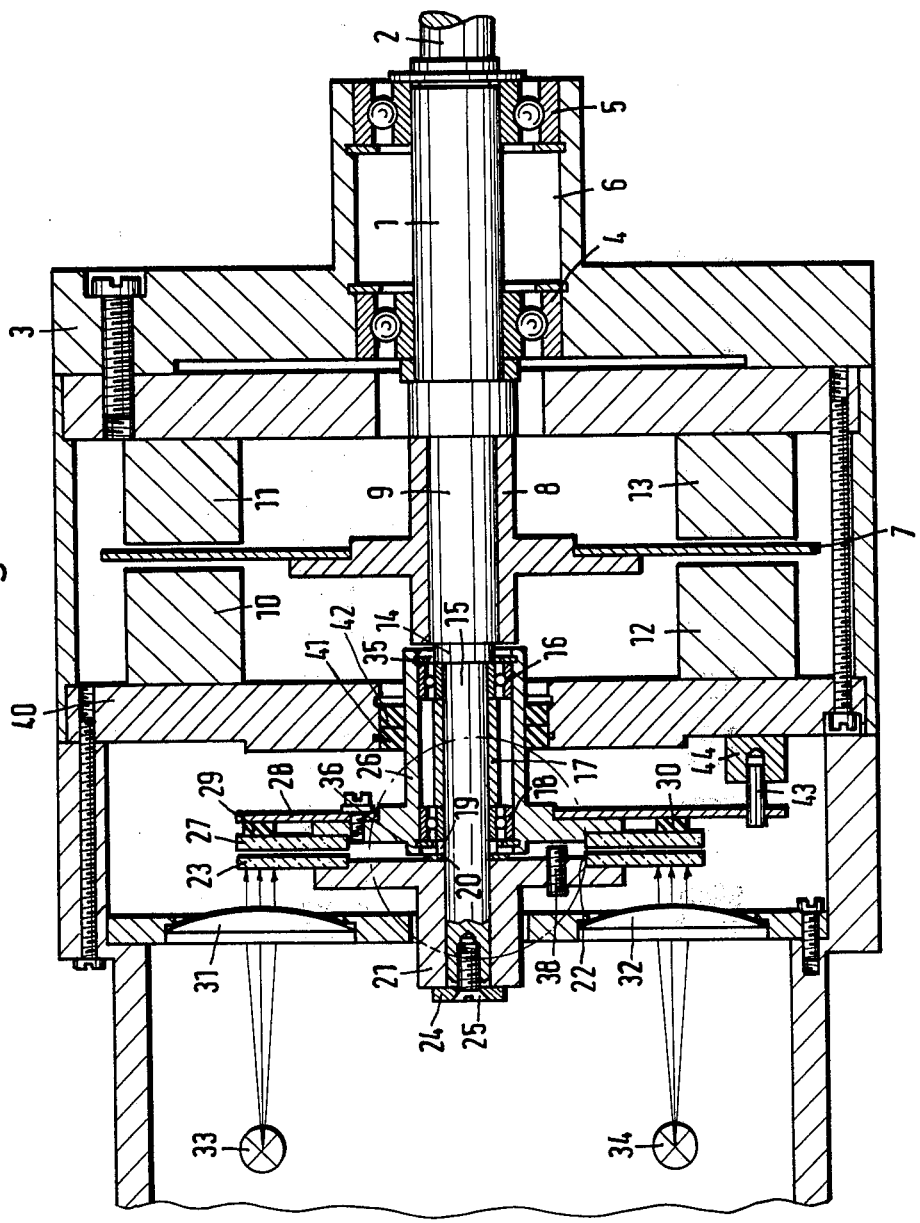
FIG. 1 shows an embodiment of an incremental rotary transmitter according to the invention mounted upon the free shaft end of a motor of the disc rotor type for driving a precision mechanism.

In FIG. 1 the driving shaft of a motor for a precision mechanism is indicated at 1, in which a high degree of rotational accuracy is required at the output side 2. The shaft 1 is mounted in a bearing shell 3 by means of high precision ball bearings 4, 5. To avoid alignment errors the bore 6 for receiving the races of the bearings 4, 5 is machined in a chuck.

The free shaft end of the shaft 1 carries a disc type rotor of a conventional type of motor. In this construction the disc rotor 7 is secured upon a bearing sleeve 8, which itself is a force fit on a shaft portion 9 integral with and of lesser diameter than the shaft 1. Permanent magnets 10, 11, 12, 13 operating upon the periphery of the disc rotor 7 produce current flow through the rotor 7 to generate the desired tongue.

The shaft portion 9 is extended inwardly in the form of an integral shoulder 14 and stub shaft 15. Starting from the shoulder 14 there are force fitted onto the stub shaft 15, in the following order, a precision ball bearing 16, a spacing sleeve 17, a further precision ball bearing 18, a spacing ring 19, a shim disc 20 and a flanged fixing sleeve 21. The fixing sleeve 21 carries, secured in a coaxial recess of its flange, an annular pulse disc 23 bearing the stripe divisions. By means of a pressure plate 24 and screw 25 the entire assembly here described is held together in the axial direction upon the stub shaft 15. The pulse disc 23 is thus rigidly secured to the stub shaft 15 of the shaft 1 for rotation about the axis of the shaft in a plane perpendicular to such axis.

The outer races of the precision roller bearings 16, 18 support a sleeve 26 upon which is securely mounted a scanning grid 27 of disc form and a conductor plate 28 with photoelectric elements 29, 30 secured thereon. The scanning grid 27, which in use of the apparatus is held stationary, is thus freely mounted on the stub shaft 15, via the sleeve 26, closely adjacent and parallel to the pulse disc 23. Two illuminating devices, each comprising a lens 31 and 32 and a lamp 33 and 34, are arranged on exactly diametrically opposite sides of the axis of the shaft 1, 9 and 15, and produce parallel light beams for illuminating the pulse disc 27. The light from the pulse disc 27 impinges upon the photocells 29 and 30 which produce electrical signals for evaluation and control of the motor in conventional manner.

Figure 2:
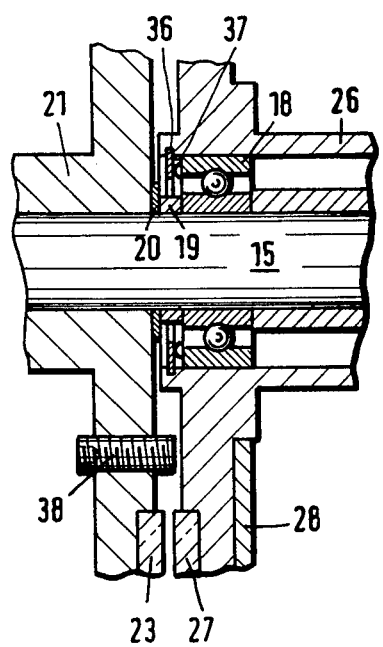
FIG. 2 is a detailed view of the circled portion of FIG. 1 to a larger scale.

For the purpose of mounting the sleeve 26 without axial play upon the outer races of the roller bearings 16, 18, the sleeve 26 is provided with an annular groove for taking a spring ring 35 and a second annular groove for taking a second spring ring 36. As may be seen in FIG. 2, between the outer race of the roller bearing 18 and the spring ring 36 there is arranged a corrugated spring ring 37, which provides the necessary bias between the two roller bearing outer races. Three adjusting screws 38 are arranged equi-angularly about the periphery of the flange of the fixing sleeve 21, and are adjusted so as to prevent any direct contact of the two closely spaced relatively moving parts 23, 27.

For the purpose of suppressing undesirable flexing oscillations of the assembled construction under conditions of high speed rotation of the shaft 1, 9 and 15, the sleeve 26 is clamped at its outer periphery in a corresponding bore in the motor bearing shield 40 by means of two resilient oscillation damping elements 41, 42. For preventing rotation of the scanning grid 27 in use, a pin 43 inserted in the conductor plate 28 projects into a bore in an elastic oscillation damping block 44, which is itself secured to the bearing shield 40 of the disc rotor motor.

I claim:

1. An incremental rotary transmitter comprising a pulse disc secured to a shaft for rotation therewith about the axis of the shaft and in a plane perpendicular to the axis, and a relatively stationary scanning grid arranged closely adjacent and parallel to the pulse disc, wherein
    the scanning grid is secured to a stationary sleeve which is internally freely mounted upon the shaft carrying the pulse disc and externally mounted in oscillation damping elements.

2. An incremental rotary transmitter as claimed in claim 1, further including spacing elements for maintaining the spacing between the pulse disc and the scanning grid.

* * * * *